United States Patent
Holden et al.

(10) Patent No.: US 9,130,056 B1
(45) Date of Patent: Sep. 8, 2015

(54) BI-LAYER WAFER-LEVEL UNDERFILL MASK FOR WAFER DICING AND APPROACHES FOR PERFORMING WAFER DICING

(71) Applicants: James M. Holden, San Jose, CA (US); James S. Papanu, San Rafael, CA (US); Wei-Sheng Lei, San Jose, CA (US); Brad Eaton, Menlo Park, CA (US); Ajay Kumar, Cupertino, CA (US)

(72) Inventors: James M. Holden, San Jose, CA (US); James S. Papanu, San Rafael, CA (US); Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/506,455

(22) Filed: Oct. 3, 2014

(51) Int. Cl.
*H01L 21/78* (2006.01)
*H01L 21/46* (2006.01)
*H01L 21/301* (2006.01)
*H01L 21/82* (2006.01)
*H01L 21/56* (2006.01)
*H01L 21/3065* (2006.01)

(52) U.S. Cl.
CPC ............ *H01L 21/82* (2013.01); *H01L 21/3065* (2013.01); *H01L 21/563* (2013.01)

(58) Field of Classification Search
USPC ........................................................ 438/460
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Asok K Sarkar
(74) *Attorney, Agent, or Firm* — Blakely Sokoloff Taylor Zafman LLP

(57) ABSTRACT

Methods of dicing semiconductor wafers, each wafer having a plurality of integrated circuits, are described. In an example, a method of dicing a semiconductor wafer having integrated circuits on a front side thereof involves laminating a pre-patterned bi-layer wafer-level underfill material stack on the integrated circuits of the semiconductor wafer. The pre-patterned bi-layer wafer-level underfill material stack has regions corresponding to the integrated circuits and gaps corresponding to dicing streets between the integrated circuits. The method also involves plasma etching to form trenches in the semiconductor wafer in alignment with the dicing streets to singulate the integrated circuits. An upper layer of the pre-patterned bi-layer wafer-level underfill material stack protects the integrated circuits during the plasma etching.

30 Claims, 5 Drawing Sheets

(56) References Cited

U.S. PATENT DOCUMENTS

| | | | |
|---|---|---|---|
| 6,057,180 | A | 5/2000 | Sun et al. |
| 6,174,271 | B1 | 1/2001 | Kosmowski |
| 6,300,593 | B1 | 10/2001 | Poweli |
| 6,306,731 | B1 | 10/2001 | Igarashi et al. |
| 6,407,363 | B2 | 6/2002 | Dunsky et al. |
| 6,426,275 | B1 | 7/2002 | Arisa |
| 6,465,158 | B1 | 10/2002 | Sekiya |
| 6,528,864 | B1 | 3/2003 | Arai |
| 6,574,250 | B2 | 6/2003 | Sun et al. |
| 6,582,983 | B1 | 6/2003 | Runyon et al. |
| 6,593,542 | B2 | 7/2003 | Baird et al. |
| 6,642,127 | B2 | 11/2003 | Kumar et al. |
| 6,676,878 | B2 | 1/2004 | O'Brien et al. |
| 6,696,669 | B2 | 2/2004 | Hembree et al. |
| 6,706,998 | B2 | 3/2004 | Cutler |
| 6,759,275 | B1 | 7/2004 | Lee et al. |
| 6,803,247 | B2 | 10/2004 | Sekiya |
| 6,887,804 | B2 | 5/2005 | Sun et al. |
| 6,998,571 | B2 | 2/2006 | Sekiya et al. |
| 7,128,806 | B2 | 10/2006 | Nguyen et al. |
| 7,129,150 | B2 | 10/2006 | Kawai |
| 7,179,723 | B2 | 2/2007 | Genda et al. |
| 7,265,033 | B2 | 9/2007 | Shigematsu et al. |
| 7,361,990 | B2 | 4/2008 | Lu et al. |
| 7,364,986 | B2 | 4/2008 | Nagai et al. |
| 7,435,607 | B2 | 10/2008 | Nagai |
| 7,459,377 | B2 | 12/2008 | Ueda et al. |
| 7,468,309 | B2 | 12/2008 | Shigematsu et al. |
| 7,473,866 | B2 | 1/2009 | Morishige et al. |
| 7,507,638 | B2 | 3/2009 | Mancini et al. |
| 7,507,639 | B2 | 3/2009 | Nakamura |
| 7,629,228 | B2 | 12/2009 | Haji et al. |
| 7,678,670 | B2 | 3/2010 | Arita et al. |
| 7,687,740 | B2 | 3/2010 | Bruland et al. |
| 7,754,584 | B2 | 7/2010 | Kumakawa |
| 7,767,551 | B2 | 8/2010 | Arita et al. |
| 7,767,554 | B2 | 8/2010 | Arita et al. |
| 7,776,720 | B2 | 8/2010 | Boyle et al. |
| 7,804,043 | B2 | 9/2010 | Deshi |
| 7,838,323 | B2 | 11/2010 | Utsumi et al. |
| 7,859,084 | B2 | 12/2010 | Utsumi et al. |
| 7,875,898 | B2 | 1/2011 | Maeda |
| 7,906,410 | B2 | 3/2011 | Arita et al. |
| 7,923,351 | B2 | 4/2011 | Arita |
| 7,926,410 | B2 | 4/2011 | Bair |
| 7,927,973 | B2 | 4/2011 | Haji et al. |
| 2003/0162313 | A1 | 8/2003 | Kim et al. |
| 2004/0080045 | A1 | 4/2004 | Kimura et al. |
| 2004/0137700 | A1 | 7/2004 | Sekiya |
| 2004/0157457 | A1 | 8/2004 | Xu et al. |
| 2004/0212047 | A1 | 10/2004 | Joshi et al. |
| 2006/0043535 | A1 | 3/2006 | Hiatt |
| 2006/0086898 | A1 | 4/2006 | Cheng et al. |
| 2006/0088984 | A1 | 4/2006 | Li et al. |
| 2006/0146910 | A1 | 7/2006 | Koochesfahani et al. |
| 2006/0205182 | A1 | 9/2006 | Soejima |
| 2009/0004780 | A1* | 1/2009 | Arita et al. .................. 438/114 |
| 2009/0255911 | A1 | 10/2009 | Krishnaswami et al. |
| 2010/0013036 | A1 | 1/2010 | Carey |
| 2010/0216313 | A1 | 8/2010 | Iwai et al. |
| 2010/0248451 | A1 | 9/2010 | Pirogovsky et al. |
| 2011/0014777 | A1 | 1/2011 | Haji et al. |
| 2011/0312157 | A1 | 12/2011 | Lei et al. |
| 2013/0045554 | A1 | 2/2013 | Yamazaki |
| 2013/0065378 | A1 | 3/2013 | Johnson et al. |
| 2013/0230972 | A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

Holden, James M. et al., "Approaches for Cleaning a Wafer During Hybrid Laser Scribing and Plasma Etching Wafer Dicing Processes," U.S. Appl. No. 14/201,452, filed Mar. 7, 2014, 60 pgs.

Holden, James M. et al., "Pre-Patterned Dry Laminate Mask for Wafer Dicing Processes," U.S. Appl. No. 14/256,429, filed Apr. 18, 2014, 62 pgs.

Lei, Wei-Sheng et al., "Stealth Dicing of Wafers Having Wafer-Level Underfill," U.S. Appl. No. 14/320,390, filed Jun. 30, 2014, 38 pgs.

Lei, Wei-Sheng et al., "Dicing of Wafers Having Wafer-Level Underfill," U.S. Appl. No. 14/320,433, filed Jun. 30, 2014, 49 pgs.

* cited by examiner

BI-LAYER WAFER-LEVEL UNDERFILL MASK FOR WAFER DICING AND APPROACHES FOR PERFORMING WAFER DICING

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110>direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having integrated circuits on a front side thereof involves laminating a pre-patterned bi-layer wafer-level underfill material stack on the integrated circuits of the semiconductor wafer. The pre-patterned bi-layer wafer-level underfill material stack has regions corresponding to the integrated circuits and gaps corresponding to dicing streets between the integrated circuits. The method also involves plasma etching to form trenches in the semiconductor wafer in alignment with the dicing streets to singulate the integrated circuits. An upper layer of the pre-patterned bi-layer wafer-level underfill material stack protects the integrated circuits during the plasma etching.

In another embodiment, a method of dicing a semiconductor wafer having integrated circuits on a front side thereof involves forming an un-patterned bi-layer wafer-level underfill material stack on the integrated circuits of the semiconductor wafer. The method also involves patterning the un-patterned bi-layer wafer-level underfill material stack to form a patterned bi-layer wafer-level underfill material stack having regions corresponding to the integrated circuits and gaps corresponding to dicing streets between the integrated circuits. The method also involves plasma etching to form trenches in the semiconductor wafer in alignment with the dicing streets to singulate the integrated circuits. An upper layer of the patterned bi-layer wafer-level underfill material stack protects the integrated circuits during the plasma etching.

In another embodiment, a method of dicing a semiconductor wafer having integrated circuits on a front side thereof involves vacuum laminating a pre-patterned bi-layer wafer-level underfill material stack on the integrated circuits of the semiconductor wafer. The pre-patterned bi-layer wafer-level underfill material stack has regions corresponding to the integrated circuits and gaps corresponding to dicing streets between the integrated circuits. A lower layer of the pre-patterned bi-layer wafer-level underfill material stack includes an epoxy or epoxide resin having approximately 30% to 70% filler of sub-micron sized silica particles. An upper layer of the pre-patterned bi-layer wafer-level underfill material stack includes an epoxy or epoxide resin essentially free from silica particles. The method further involves plasma etching to form trenches in the semiconductor wafer in alignment with the dicing streets to singulate the integrated circuits. The upper layer of the pre-patterned bi-layer wafer-level underfill material stack protects the integrated circuits during the plasma etching.

BRIEF DESCRIPTION OF THE DRAWINGS

FIGS. 2A-2E illustrate cross-sectional views of various operations in a method employing a bi-layer wafer-level underfill mask for wafer dicing, in accordance with an embodiment of the present invention, wherein:

FIG. 2A illustrates a wafer prior to receiving a wafer level underfill material thereon;

FIG. 2B illustrates the pairing of a plurality of bi-layer wafer level underfill material stacks with corresponding integrated circuits of the wafer of FIG. 2A;

FIG. 2C illustrates the paired wafer/bi-layer underfill of FIG. 2B as supported on a substrate carrier in preparation for die singulation;

FIG. 2D illustrates the wafer of FIG. 2C following plasma dicing; and

FIG. 2E illustrates an embodiment where a singulated die of FIG. 2D has an etched back upper layer of the b-layer wafer level underfill material stack.

DETAILED DESCRIPTION

Figure 1:
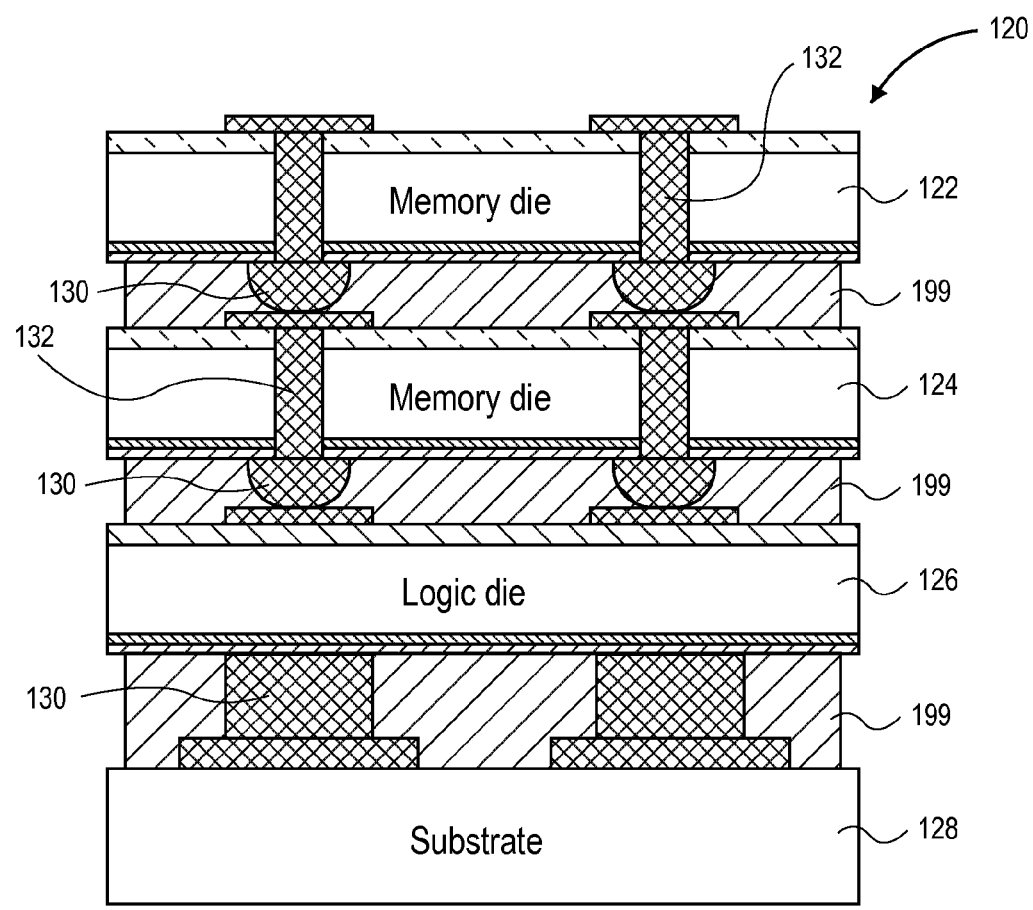
FIG. 1 illustrates a cross-sectional view of a stack of dies as coupled to a package substrate, in accordance with an embodiment of the present invention.

Methods of dicing semiconductor wafers, each wafer having a plurality of integrated circuits thereon, are described. In the following description, numerous specific details are set forth, such as dicing approaches and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A wafer or substrate dicing process may be implemented for die singulation. In an embodiment, wafers including a wafer level underfill material thereon are subjected to such a dicing process that involves use of a pre-patterned bi-layer wafer level underfill (WLUF) material. In particular, a bi-layer wafer level underfill mask may be used for a plasma dicing based singulation process.

Embodiments described herein may be directed to use of a plasma dicing mask during semiconductor integrated circuit production. For example, after integrated circuit devices have been formed upon a semiconductor substrate such as a 300 millimeter silicon wafer, the individual devices must be separated from the semiconductor substrate by a process known as singulation or simply "dicing" where it is said wafers are "diced" into the individual devices, called "chips" or "die", prior to picking for later processing and packaging into products. Various approaches exist for dicing substrates into chips including scribe and break, mechanical sawing with an abrasive cutting wheel, laser ablation, and plasma dicing. Embodiments described herein may be particular relevant for a plasma dominant dicing process.

To provide context, during plasma dicing, a substrate with finished devices on the top side and that has been thinned and optionally had metallization applied to the bottom side, is affixed to dicing tape by an adhesive applied to the dicing tape. The dicing tape is affixed to a dicing ring of metal or plastic. The ring supports tape around the perimeter of the wafer. Both the ring and wafer are attached to the dicing tape from the same side. After the dicing process has been completed, the dicing tape continues to support the diced chips in place where they were diced from the semiconductor substrate. The dicing frame is then transferred to equipment suitable for picking individual die from the tape and applying the die onto another substrate, such as an interposer or a circuit board.

To provide further context, electrical connections to the die are generally made either from the front of the die through wire bonding where fine wire is attached to bonding pads or, increasingly more common, where the bond pads are prepared with solder bumps or solder covered copper pillars. The chip is "flipped" upside down with the device layers and solder covered connections facing down towards the substrate, optionally fluxed, and solder connection made to the substrate through the application of heat and pressure. The latter technology was invented by IBM in the 1960s and named "C4" but is generally called "flip chip" today. In flip chip, the short connections provide for shorter delays and denser packaging than wire bond, but often the substrate typically has a different coefficient of thermal expansion (CTE) than the silicon chip. Accordingly, when the soldered chip cools after soldering to the substrate, the substrate will shrink a different amount than the silicon chip and create stress on the connections and especially the connections near the periphery of the chip where thermal displacement is greatest. To solve this problem, the gap between the silicon chip and the substrate is filled with a material engineered to have a CTE lower than the substrate and closer, but typically higher, than the silicon chip. The inclusion of such a material has the effect of distributing the stress that would have been concentrated at the connections across the entire sandwich of chip, filling material, and substrate. The filling material is called "underfill."

It is to be appreciated that processes described herein can be used to facilitate ultimate fabrication of a variety of substrate/die packages and even extended to include three-dimensional (3D) architectures. As a perhaps somewhat exotic example, FIG. 1 illustrates a cross-sectional view of a stack of dies as coupled to a package substrate, in accordance with an embodiment of the present invention. Referring to FIG. 1, a logic die/memory die hybrid 3D stacking structure 120 includes a first memory die 122 coupled to a second memory die 124. The second memory die 124 is coupled to a logic die 126. The logic die 126 is coupled to a package substrate or printed circuit board (PCB) 128. As depicted in FIG. 1, the coupling can be effected by use of backside bumps 130 and through-silicon-vias (TSVs) 132. As is also depicted in FIG. 1, an underfill material 199 may be included between substrate/die, or die/die pairings in final products as a passivation layer.

The underfill material is typically a highly engineered composite of 30% to 70% low CTE micron and sub-micron sized silica filler particles in an epoxy or epoxide resin balance along with additives such as fluxing agents, depending on application. Silica is nearly universally chosen as the filler material because of its very low CTE of 0.55 parts per million per degree Celsius. Other properties important for the underfill material include correct rheological properties, high modulus, ability to exclude moisture, electrically insulating, and to be thermally conducting. The underfill material can be applied to the gap between chip and substrate after soldering via capillary filling, on the picked die prior to soldering, or on the pre-diced wafer via techniques such as spin/spray coat, screen printing and stenciling, or dry film lamination.

However, the trend in IC chip packaging is moving from individual die level packaging to wafer level packaging. This trend has driven the move for underfill material from being conventionally dispensed at the individual die level, i.e., after die singulation to being applied to the whole wafer level prior to die singulation. When the underfill is applied before wafer dicing, it is known specifically as "wafer level underfill" or WLUF. In WLUF, the underfill epoxy or epoxide is typically B-staged so that it is formable but not fluid such that the covered wafer can be handled without the resin flowing off the wafer surface. The wafer is diced subsequent to WLUF application and the diced chips are then ready for soldering directly to the substrate and the WLUF being cured during or directly after the soldering process.

In another aspect, in a plasma wafer dicing process, a patterned etch mask is applied to the surface of the wafer, the wafer attached to a carrier wafer (such as the tape frame discussed above), and loaded into a plasma dicing chamber. The wafer is then diced through by a cyclic etching process where, e.g., alternating cycles of polymer deposition and sputter etch create deep trenches around the dies until singulation is achieved. In an example, the deposition phase may be achieved by a $C_4F_8$-based plasma chemistry which deposits a uniform fluorocarbon polymer that is resistant to the etch phase chemistry. The etch phase may be achieved by switching the chemistry to $SF_6$ accompanied by an RF bias which drives plasma ions vertically onto the substrate surface. The result is sputtering horizontal surfaces free of protective fluorocarbon polymer and allowing the trench bottoms to be etched away, but leaving vertical surfaces covered and inert to the fluorine etchant. Dozens or hundreds of cycles can be used to etch very deep and vertical trenches over time.

In plasma dicing, the patterned mask defines the die by not covering the dicing lanes thereby exposing them to the plasma etch. Many avenues exist to obtain such a patterned mask including photolithography, screen and stencil printing, pre-patterned dry film vacuum lamination, mechanical scribing, and laser ablation scribing. The etch mask may be applied as a dedicated mask for subsequent removal or, in the case of a WLUF, the WLUF itself may be double-purposed to the task of a plasma dicing etch mask.

Double purposing the WLUF as an etch mask may pose a problem, however, in that the above described $SF_6$ etch chemistry can exhibit different etch rates for silicon, silica, and epoxies or epoxides and organics such as polyimide and acrylic. The inventors have found that, as the plasma dicing is carried out, if the epoxy or epoxide etch rate exceeds the silica etch rate, the epoxy or epoxide in the WLUF may be gradually worn away in the $SF_6$ chemistry, but the silica filler may not be etched. As the etch progresses, filler density at the exposed top of the WLUF may gradually increase until the top is mostly comprised of only silica filler particles.

The result may pose a problem eventually during soldering as the near 100% filler region of the etched WLUF may not flow from between the contact pads and the solder bumps. Instead, the near 100% filler region of the etched WLUF can become trapped at the contact point causing contact failures. If the etch rate of the silica exceeds the etch rate of the epoxy or epoxide, the silica may be removed preferentially leaving voids in the WLUF also leading to reliability issues. Only when the two etch rates of silica, and the particular epoxy or epoxide used in the WLUF, match closely, are there no detrimental effects of double purposing the WLUF as an etch mask for plasma dicing.

In accordance with one or more embodiments described herein, an additional layer of uniform etch mask is applied subsequent to or simultaneously with the wafer level underfill material, prior to dicing. In one such embodiment, the additional layer is a homogeneous uniform layer that may be removed subsequent to dicing the chip and prior to soldering to the chip to its substrate. In a specific such embodiment, an oxygen-strippable material such as polyimide is employed as the upper layer, and can be removed in an etch chamber in an ashing process. In another specific embodiment, the additional layer is an unfilled epoxy or epoxide resin, and there may be an added advantage that the remaining additional layer may be left in place without affecting the soldering process. If left in place, the additional layer may also include fluxing agents to aid in forming a reliable solder connection.

In an exemplary processing scheme, FIGS. 2A-2E illustrate cross-sectional views of various operations in a method employing a bi-layer wafer-level underfill mask for wafer dicing, in accordance with an embodiment of the present invention.

Figure 2A:
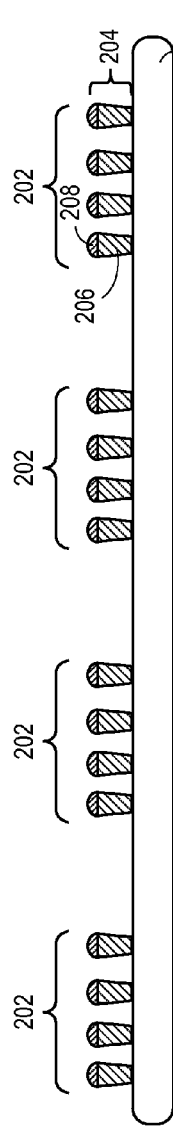

FIG. 2A illustrates a wafer prior to receiving a wafer level underfill material thereon. Referring to FIG. 2A, a wafer 200 has regions of integrated circuits 202 thereon. The integrated circuits 202 each include a plurality of conductive structures 204, such as a plurality of copper pillars 206 each having a reflowed solder bump 208 thereon.

Figure 2B:
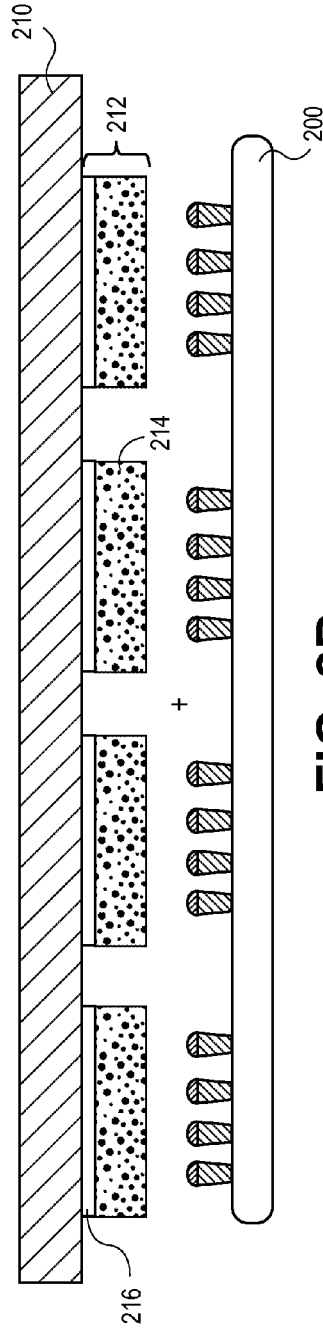

FIG. 2B illustrates the pairing of a plurality of bi-layer wafer level underfill material stacks with corresponding integrated circuits of the wafer of FIG. 2A. Referring to FIG. 2B, a laminate carrier film 210 includes a pre-patterned dry laminate 212 thereon. The pre-patterned dry laminate 212 is a laminate of regions of a bi-layer wafer level underfill material stack. The bi-layer wafer level underfill material stack includes a lower layer 214 (described as "lower" with respect to its ultimate position as proximate to a face-up wafer) and an upper layer 216 (described as "upper" with respect to its ultimate position as distal from the face up wafer, i.e., above the lower layer). It is to be appreciated that although FIG. 2B depicts the laminate carrier film 210 as above the wafer 200, the assembly may instead be flipped over to provide the wafer 200 above the laminate carrier film 210.

Referring again to FIG. 2B, in an embodiment, the bi-layer wafer level underfill material stack 212 is applied from the laminate carrier film 210 by bringing the laminate bi-layer wafer level underfill material stack 212 into contact with the wafer 200 under vacuum. However, in another embodiment, the bi-layer wafer level underfill material stack 212 is not pre-patterned and is applied by dry film lamination or two subsequent liquid applications. In the latter embodiment, a liquid or paste is applied by a process such as spin-on or screen printing. Application of such an un-patterned bi-layer wafer level underfill material stack may then be followed by a patterning step such as laser ablation, mechanical scribing or other suitable patterning operation.

Referring again to FIG. 2B, in an embodiment, the upper layer 216 of the bi-layer wafer level underfill material stack 212 is an oxygen-strippable material such as polyimide. In another embodiment, the upper layer 216 of the bi-layer wafer level underfill material stack 212 is an unfilled epoxy or epoxide resin.

Referring again to FIG. 2B, in an embodiment, the lower layer 214 of the bi-layer wafer level underfill material stack 212 is a material such as, but not limited to, a B-staged epoxy such as Intervia™ or Cyclotene™ both available from Dow Chemical, a polyimide such as Pimel™ available from Asahi KASEI, or a polybenzoxazole such as Sumiresin™ available from Sumitomo Bakelite.

Figure 2C:
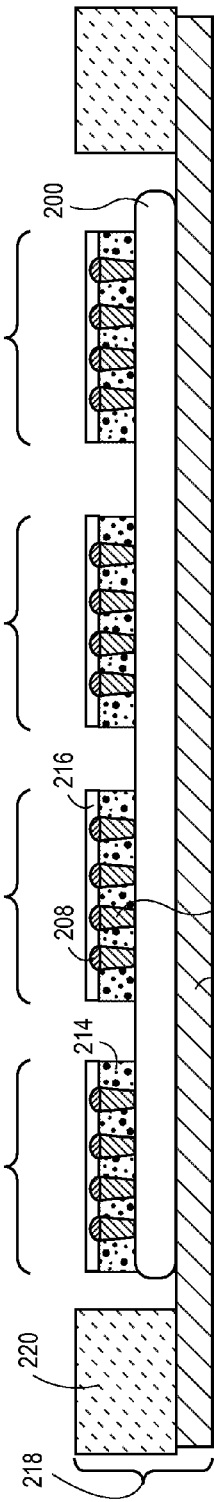

FIG. 2C illustrates the paired wafer/bi-layer underfill of FIG. 2B as supported on a substrate carrier in preparation for die singulation. Referring to FIG. 2C, the paired wafer 200 and bi-layer wafer level underfill material stack 212 is positioned on a substrate carrier 218. In a particular example, the paired wafer 200 and bi-layer wafer level underfill material stack 212 is supported on a dicing tape 222 of the substrate carrier 218. The dicing tape 222 is supported by an overlying frame 220.

Referring again to FIG. 2C, the bi-layer wafer level underfill material stack 212 is patterned with regions that correspond to the integrated circuits 202 of the wafer 200. Thus, in an embodiment, only the integrated circuit portions 202 of the wafer 202 are covered with the bi-layer wafer level underfill material stack 212, leaving exposed regions of the wafer 200 between the covered integrated circuit/bi-layer pairings 202/212. As described in association with FIG. 2B, the bi-layer wafer level underfill material stack 212 may be pre-patterned or may be patterned following lamination.

Referring again to FIG. 2C, in an embodiment, the interface of the lower layer 214 and the upper layer 216 of each bi-layer wafer level underfill material stack 212 is approximately co-planar with the interface of each copper pillar 206 and the solder bump 208 pairing of each integrated circuit 202, as is depicted in FIG. 2C. However, in another embodiment, the interface of the lower layer 214 and the upper layer 216 of each bi-layer wafer level underfill material stack 212 is lower (closer to the substrate surface) than the interface of each copper pillar 206 and the solder bump 208 pairing of each integrated circuit 202. In yet another embodiment, the interface of the lower layer 214 and the upper layer 216 of each bi-layer wafer level underfill material stack 212 is higher (farther from the substrate surface) than the interface of each copper pillar 206 and the solder bump 208 pairing of each integrated circuit 202.

Thus, perhaps more generally, FIG. 2C illustrates the finished wafer with the bi-layer WLUF patterned around the individual dies. The wafer attached to a suitable carrier wafer for dicing such as a dicing tape attached to a metal or plastic dicing frame. As depicted in FIG. 2C, the re-flowed solder is shown protruding somewhat into the non-filled (top) layer of the bi-layer WLUF, yet still protected from a subsequent plasma etch. The arrangement advantageously creates a region free of silica above the solder bumps such that the soldering is not interfered with by the silica particles. The carrier/wafer arrangement of FIG. 2C may be ready for plasma dicing, as described below in association with FIG. 2D. However, in one embodiment, as an intermediate process to FIGS. 2C and 2D, a laser scribing operation may be performed to, e.g., remove device layers from streets between integrated circuits. In one such embodiment, an un-patterned WLUF layer can be patterned with the same laser used for such laser scribing.

Figure 2D:
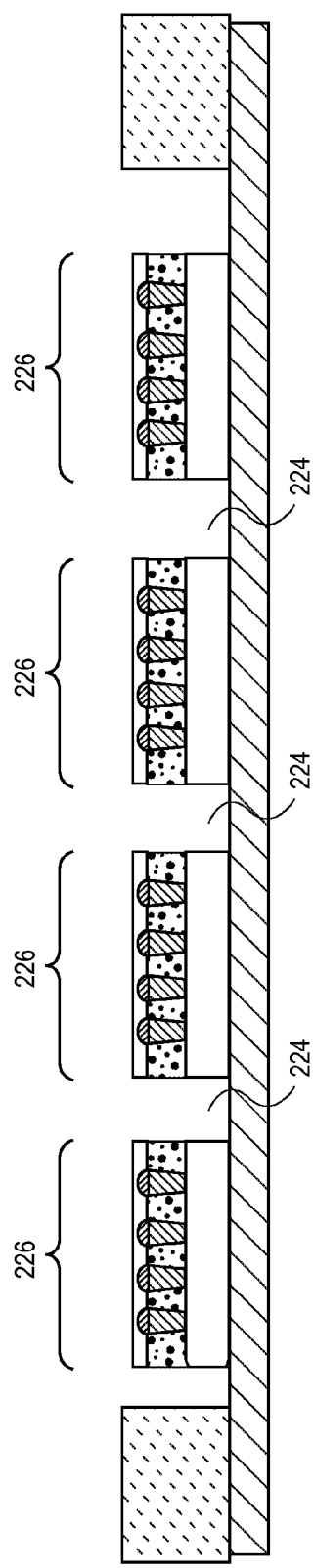

FIG. 2D illustrates the wafer of FIG. 2C following plasma dicing. Referring to FIG. 2D, the covered integrated circuit/bi-layer pairings 202/212 of FIG. 2D are singulated by plasma etching to provide singulated pairings 226. The singulated pairings 226 are separated by gaps 224 formed during the plasma etching. In one such embodiment, the upper layer 216 of the bi-layer wafer level underfill material stack 212 protects the integrated circuits (including the pillar/bump pairings) during the plasma etch die singulation processing.

Referring again to FIG. 2D, the singulated pairings 226 are ready for die pick and soldering. In one embodiment, the non-filled (upper) layer 216 of the bi-layer WLUF 212 is only partially consumed and remains protecting the copper pillars and solder bumps, as is depicted in FIG. 2D. In a specific embodiment, the upper layer 216 is subsequently completely removed by an ashing process, e.g., in the case that the upper layer 216 is an oxygen-strippable material such as polyimide. In an embodiment, the ashing process involves an oxygen-based plasma process as performed in a same etch chamber used to singulate the dies. In other embodiments, other wet or dry processing operations may be combined with or used in place of a plasma ashing operation.

In another embodiment, however, the upper layer 216 is composed of a same or similar B-staged epoxy or epoxide as is used for the lower layer 214 of the bi-layer WLUF 212. In one such embodiment, at least a portion of the upper layer 216 is left to remain in place without detriment, so long as the remaining material does not substantially dilute the average silica filler percentage of the total remaining WLUF film.

In yet another embodiment, the plasma etch process used for die singulation is conducted in in a manner to result in exposed solder bumps upon completion of the etch process. For example, in one embodiment, $O_2$ is added to $SF_6$ process gas during die singulation to enhance removal of an epoxy or epoxide or polyimide upper layer 216. However, it is to be appreciated that care must be taken to avoid exposure of any copper in the device (e.g., from copper pillar 206). In an example, the formation of copper sulfide "cauliflower" structures could result in failure.

Figure 2E:
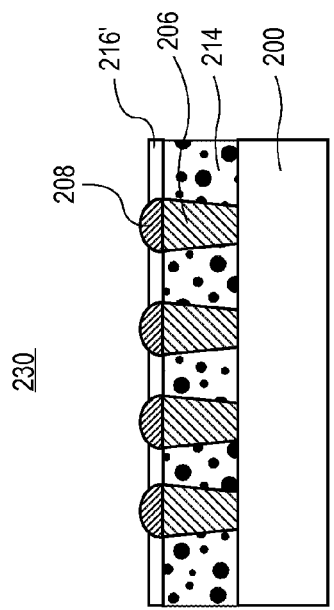

In an exemplary embodiment, FIG. 2E illustrates a singulated die 230 having an etched back upper layer 216' (i.e., a partially remaining upper layer). That is, FIG. 2E shows an embodiment where an etched upper layer exposes solder bumps 208. The exposed solder bumps may enable contact to bond pads of another die or substrate without the need to press the chip into the bond pads. In a specific embodiment, by retaining a portion of the upper layer 216, a B-staged epoxy or epoxide can be flowed around the bumps with the ability to allow for the use of separate fluxing agents to improve the solder bond.

Figure 3:
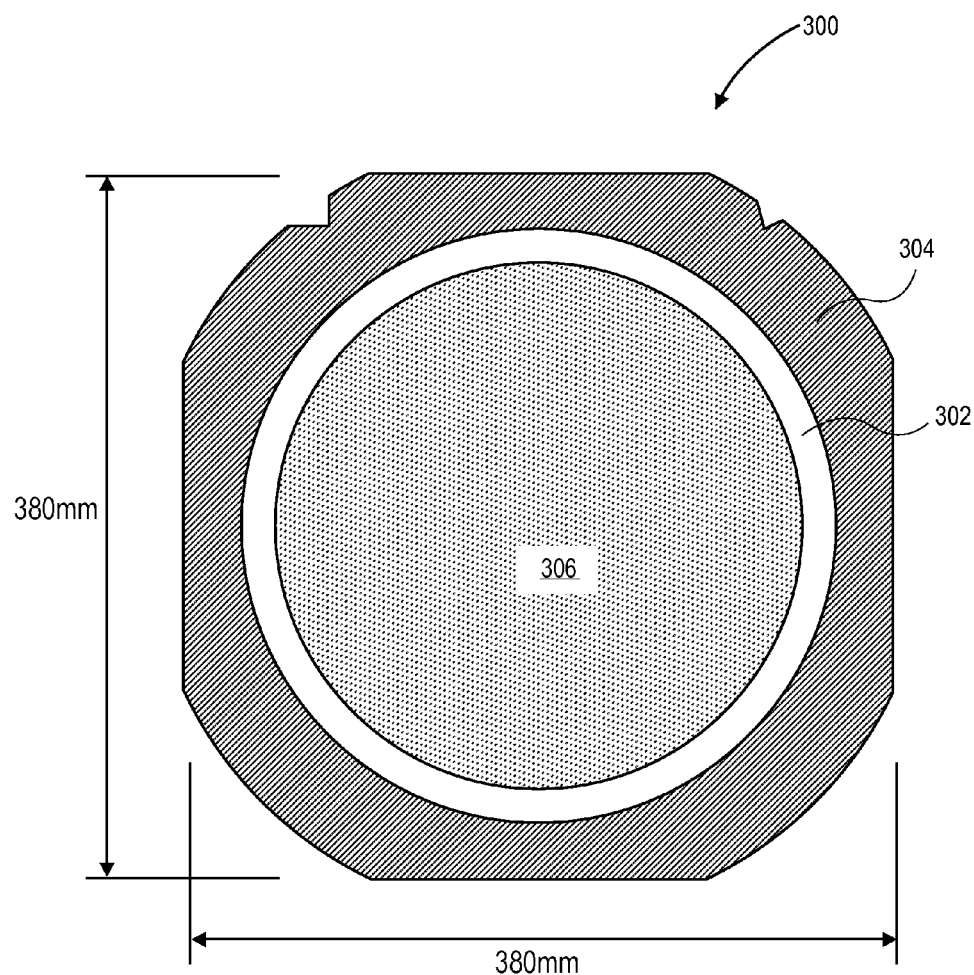
FIG. 3 illustrates a plan view of a substrate carrier suitable for supporting a wafer during a singulation process, in accordance with an embodiment of the present invention.

As shown in FIGS. 2C and 2D, as substrate carrier may be used to support a wafer during one or more of the above described singulation operations. It is to be appreciated that wafer substrate and substrate carrier sizing may vary by application. As one such example, FIG. 3 illustrates a plan view of a substrate carrier suitable for supporting a wafer during a singulation process, in accordance with an embodiment of the present invention. Referring to FIG. 3, a substrate carrier 300 includes a layer of backing tape 302 surrounded by an overlying tape ring or frame 304. A wafer or substrate 306 is supported by the backing tape 302 of the substrate carrier 300. In one embodiment, the wafer or substrate 306 is attached to the backing tape 302 by a die attach film. In one embodiment, the tape ring or frame 304 is composed of stainless steel.

In an embodiment, a singulation process can be accommodated in a single system (e.g., a cluster tool) or in a plurality of stand-alone systems sized to receive a substrate carrier such as the substrate carrier 300. In one such embodiment, such a system can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 200 or 450 millimeter wafers or substrates or, more particularly, substrate carriers sized to support 200 or 450 millimeter wafers or substrates. It is also to be appreciated that systems can be designed to handle any size substrate carrier.

In an embodiment, semiconductor wafer or substrate 200 is composed of a material suitable to withstand a fabrication process and upon which semiconductor processing layers may suitably be disposed. For example, in one embodiment, semiconductor wafer or substrate 200 is composed of a group IV-based material such as, but not limited to, crystalline silicon, germanium or silicon/germanium. In a specific embodiment, providing semiconductor wafer or substrate 200 includes providing a monocrystalline silicon substrate. In a particular embodiment, the monocrystalline silicon substrate is doped with impurity atoms. In another embodiment, semiconductor wafer or substrate 200 is composed of a material such as, e.g., a material substrate used in the fabrication of light emitting diodes (LEDs).

In an embodiment, the semiconductor wafer or substrate 200 has disposed thereon or therein, as a portion of integrated circuits included thereon or therein, an array of semiconductor devices, i.e., fabricated in device layers of the semiconductor wafer or substrate 200. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Materials making up the streets or lanes between integrated circuits may be similar to or the same as those materials used to form the integrated circuits. For example, the streets or lanes may be composed of layers of dielectric materials, semiconductor materials, and metallization. In one embodiment, one or more of the streets or lanes includes test devices similar to the actual devices of the integrated circuits.

One or both of the layers of the above described bi-layer wafer-level underfill (WLUF) material layer may be composed of a material suitable for inclusion on the top of the chips (device side) in a stack of chips to create a thermal short and also to provide a mechanically stable connection between the stacked chips. Such an under-fill material layer should generally have (1) very low electrical conductivity, (2) high thermal conductivity, (3) coefficient of thermal expansion closely matched to the chip bulk material e.g. silicon, (4) good adhesion to the various passivation layers and molding compounds that are used on the tops and bottoms of the chips e.g. silicon nitrides, oxides, polyimides, and (5) advantageous rheology allowing formability around the topology of the pillars and bumps found on the device side of the chip without leaving voids.

As described above, in an embodiment, plasma etching may be performed as a dominant component, if not only component, of a die singulation process. For example, a silicon substrate may be etched by a plasma etch process during one or more of the above described approaches. In one such embodiment, an ultra-high-density plasma source is used for the plasma etching portion of the substrate patterning process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon may be used. In a specific embodiment, the etch process is used to etch a silicon substrate and is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In an embodiment, a through-silicon via type etch process is used for the plasma etching operation described above. For example, in a specific embodiment, the etch rate of the material of a silicon substrate is greater than 25 microns per minute. In an exemplary embodiment, a deep silicon etch is used to etch a single crystalline silicon substrate or wafer at an etch rate greater than approximately 40% of conventional silicon etch rates while maintaining essentially precise profile control and virtually scallop-free sidewalls. In another embodiment, the plasma etching operation described above employs a conventional Bosch-type dep/etch/dep process to etch through the substrate. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which can be rough. In addition, the deposition sub-step in a Bosch process generates a fluorine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (approximately 0.15 um/min) so the smoothening treatment is more controllable. The high bias power is applied to achieve relatively high directional etch rates to etch off the ridges or rims on the sidewall.

As described in association with FIGS. 2C and 2D, a laser scribing process is optionally used to remove fragile device layers on the dicing street or lane prior to performing a plasma etch dominated singulation process. That is, patterning of the device layers in the wafer streets or lanes may be performed by a laser scribing process. In an embodiment, patterning of the device layers in the wafer streets or lanes with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the device layers and, possibly, a portion of the underlying semiconductor wafer or substrate.

In an embodiment, parameters for a femtosecond laser-based process may be selected to have an essentially common ablation effect on the device layers even though the general energy absorption characteristics of such materials may differ widely under certain conditions. In one such embodiment, a high intensity and short pulse width femtosecond-based laser process is used. In a specific embodiment, pulses of approximately less than or equal to 400 femtoseconds are used in a femtosecond-based laser irradiation process to remove the device layers in the wafer streets or lanes.

By contrast, if non-optimal laser parameters are selected, in a stacked structure that involves the device layers, a laser ablation process may cause delamination issues. For example, a laser penetrate through high bandgap energy dielectrics without measurable absorption. In an embodiment, while picoseconds-based laser irradiation processes lead to microcracking and delaminating in complex stacks, femtosecond-based laser irradiation processes have been demonstrated to not lead to microcracking or delamination of the same material stacks.

In accordance with an embodiment of the present invention, suitable femtosecond-based laser processes for patterning of the device layers in the wafer streets or lanes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 15 uJ. In an embodiment, the laser scribing process for patterning of the device layers in the wafer streets or lanes runs along a work piece surface at a speed approximately in the range of 500 mm/sec to 5 m/sec, although preferably approximately in the range of 600 mm/sec to 2 m/sec.

The scribing process for patterning of the device layers in the wafer streets or lanes may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface. If desired, wider kerf widths are readily obtained with additional passes.

Parameters may be selected to provide meaningful process throughput for patterning of the device layers in the wafer streets or lanes with precisely controlled ablation width (e.g., kerf width) and depth. As described above, a femtosecond-based laser may be far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with a process tool used for performing one or more of the above described process operations. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 4:
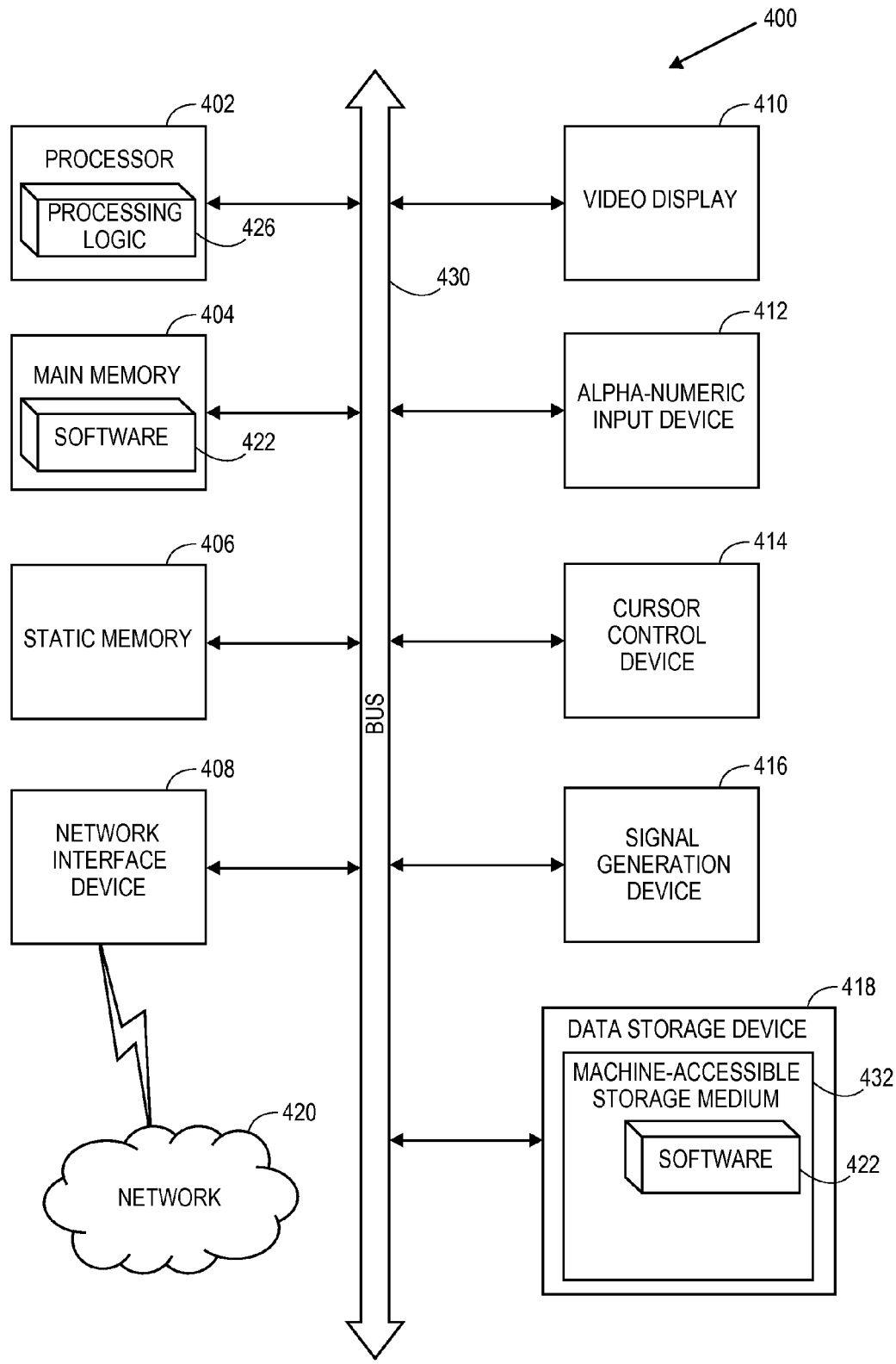
FIG. 4 illustrates a block diagram of an exemplary computer system, in accordance with an embodiment of the present invention.

FIG. 4 illustrates a diagrammatic representation of a machine in the exemplary form of a computer system 400 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 400 includes a processor 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a secondary memory 418 (e.g., a data storage device), which communicate with each other via a bus 430.

Processor 402 represents one or more general-purpose processing devices such as a microprocessor, central processing unit, or the like. More particularly, the processor 402 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 402 may also be one or more special-purpose processing devices such as an application specific integrated circuit (ASIC), a field programmable gate array (FPGA), a digital signal processor (DSP), network processor, or the like. Processor 402 is configured to execute the processing logic 426 for performing the operations described herein.

The computer system 400 may further include a network interface device 408. The computer system 400 also may include a video display unit 410 (e.g., a liquid crystal display (LCD), a light emitting diode display (LED), or a cathode ray tube (CRT)), an alphanumeric input device 412 (e.g., a keyboard), a cursor control device 414 (e.g., a mouse), and a signal generation device 416 (e.g., a speaker).

The secondary memory 418 may include a machine-accessible storage medium (or more specifically a computer-readable storage medium) 432 on which is stored one or more sets of instructions (e.g., software 422) embodying any one or more of the methodologies or functions described herein. The software 422 may also reside, completely or at least partially, within the main memory 404 and/or within the processor 402 during execution thereof by the computer system 400, the main memory 404 and the processor 402 also constituting machine-readable storage media. The software 422 may further be transmitted or received over a network 420 via the network interface device 408.

While the machine-accessible storage medium 432 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform an above described method or a portion of an above described method of dicing a wafer or substrate in a fab or other manufacturing environment.

Thus, methods of dicing semiconductor wafers, each wafer having a plurality of integrated circuits, have been disclosed.

What is claimed is:

1. A method of dicing a semiconductor wafer having integrated circuits on a front side thereof, the method comprising:
    laminating a pre-patterned bi-layer wafer-level underfill material stack on the integrated circuits of the semiconductor wafer, the pre-patterned bi-layer wafer-level underfill material stack having regions corresponding to the integrated circuits and gaps corresponding to dicing streets between the integrated circuits;
    plasma etching to form trenches in the semiconductor wafer in alignment with the dicing streets to singulate the integrated circuits, wherein an upper layer of the pre-patterned bi-layer wafer-level underfill material stack protects the integrated circuits during the plasma etching; and
    subsequent to the plasma etching, removing some but not all remaining portions of the upper layer of the pre-patterned bi-layer wafer-level underfill material stack.

2. The method of claim 1, wherein laminating the pre-patterned bi-layer wafer-level underfill material stack on the integrated circuits of the semiconductor wafer comprises performing the lamination under vacuum.

3. The method of claim 1, wherein removing some but not all remaining portions of the upper layer of the pre-patterned bi-layer wafer-level underfill material stack comprises performing a plasma ashing process.

4. The method of claim 1, wherein the plasma etching removes a portion of the upper layer of the pre-patterned bi-layer wafer-level underfill material stack.

5. The method of claim 4, wherein the plasma etching comprises using an etch gas based on a combination of $O_2$ and $SF_6$.

6. The method of claim 1, further comprising:
    subsequent to plasma etching, coupling one of the singulated integrated circuits to bond pads of a package substrate or die, wherein at least a portion of the pre-patterned bi-layer wafer-level underfill material stack is retained for the coupling.

7. The method of claim 1, wherein laminating the pre-patterned bi-layer wafer-level underfill material stack on the integrated circuits of the semiconductor wafer comprises providing a lower layer of the of the pre-patterned bi-layer wafer-level underfill material stack approximately co-planar with copper pillars of the integrated circuits, and providing the upper layer covering solder bumps formed on the copper pillars.

8. The method of claim 1, further comprising:
    subsequent to laminating the pre-patterned bi-layer wafer-level underfill material stack on the integrated circuits of the semiconductor wafer and prior to plasma etching to form trenches in the semiconductor wafer, laser scribing the dicing streets to remove device layers from the dicing streets.

9. A method of dicing a semiconductor wafer having integrated circuits on a front side thereof, the method comprising:
    forming an un-patterned bi-layer wafer-level underfill material stack on the integrated circuits of the semiconductor wafer;
    patterning the un-patterned bi-layer wafer-level underfill material stack to form a patterned bi-layer wafer-level underfill material stack having regions corresponding to the integrated circuits and gaps corresponding to dicing streets between the integrated circuits;
    plasma etching to form trenches in the semiconductor wafer in alignment with the dicing streets to singulate the integrated circuits, wherein an upper layer of the patterned bi-layer wafer-level underfill material stack protects the integrated circuits during the plasma etching; and
    subsequent to the plasma etching, removing some but not all remaining portions of the upper layer of the patterned bi-layer wafer-level underfill material stack.

10. The method of claim 9, wherein removing some but not all remaining portions of the upper layer of the patterned bi-layer wafer-level underfill material stack comprises performing a plasma ashing process.

11. The method of claim 9, wherein the plasma etching removes a portion of the upper layer of the patterned bi-layer wafer-level underfill material stack.

12. The method of claim 9, further comprising:
    subsequent to plasma etching, coupling one of the singulated integrated circuits to bond pads of a package substrate or die, wherein at least a portion of the patterned bi-layer wafer-level underfill material stack is retained for the coupling.

13. A method of dicing a semiconductor wafer having integrated circuits on a front side thereof, the method comprising:
    vacuum laminating a pre-patterned bi-layer wafer-level underfill material stack on the integrated circuits of the semiconductor wafer, the pre-patterned bi-layer wafer-level underfill material stack having regions corresponding to the integrated circuits and gaps corresponding to dicing streets between the integrated circuits, wherein a lower layer of the pre-patterned bi-layer wafer-level underfill material stack comprises an epoxy or epoxide resin having approximately 30% to 70% filler of sub-micron sized silica particles, and an upper layer of the pre-patterned bi-layer wafer-level underfill material stack comprises an epoxy or epoxide resin essentially free from silica particles; and
    plasma etching to form trenches in the semiconductor wafer in alignment with the dicing streets to singulate the integrated circuits, wherein the upper layer of the pre-patterned bi-layer wafer-level underfill material stack protects the integrated circuits during the plasma etching.

14. The method of claim 13, further comprising:
    subsequent to plasma etching, coupling one of the singulated integrated circuits to bond pads of a package substrate or die, wherein at least a portion of the pre-patterned bi-layer wafer-level underfill material stack is retained for the coupling.

15. A method of dicing a semiconductor wafer having integrated circuits on a front side thereof, the method comprising:
    laminating a pre-patterned bi-layer wafer-level underfill material stack on the integrated circuits of the semiconductor wafer, the pre-patterned bi-layer wafer-level underfill material stack having regions corresponding to the integrated circuits and gaps corresponding to dicing streets between the integrated circuits;
    plasma etching to form trenches in the semiconductor wafer in alignment with the dicing streets to singulate the integrated circuits, wherein an upper layer of the pre-patterned bi-layer wafer-level underfill material stack protects the integrated circuits during the plasma etching; and
    subsequent to the plasma etching, removing all remaining portions of the upper layer of the pre-patterned bi-layer wafer-level underfill material stack, wherein removing all remaining portions of the upper layer of the pre-patterned bi-layer wafer-level underfill material stack comprises performing a plasma ashing process.

16. The method of claim 15, wherein laminating the pre-patterned bi-layer wafer-level underfill material stack on the integrated circuits of the semiconductor wafer comprises performing the lamination under vacuum.

17. The method of claim 15, wherein the plasma etching removes a portion of the upper layer of the pre-patterned bi-layer wafer-level underfill material stack.

18. The method of claim 17, wherein the plasma etching comprises using an etch gas based on a combination of $O_2$ and $SF_6$.

19. The method of claim 15, further comprising:
    subsequent to plasma etching, coupling one of the singulated integrated circuits to bond pads of a package substrate or die, wherein at least a portion of the pre-patterned bi-layer wafer-level underfill material stack is retained for the coupling.

20. The method of claim 15, wherein laminating the pre-patterned bi-layer wafer-level underfill material stack on the integrated circuits of the semiconductor wafer comprises providing a lower layer of the of the pre-patterned bi-layer wafer-level underfill material stack approximately co-planar with copper pillars of the integrated circuits, and providing the upper layer covering solder bumps formed on the copper pillars.

21. The method of claim 15, further comprising:
    subsequent to laminating the pre-patterned bi-layer wafer-level underfill material stack on the integrated circuits of the semiconductor wafer and prior to plasma etching to form trenches in the semiconductor wafer, laser scribing the dicing streets to remove device layers from the dicing streets.

22. A method of dicing a semiconductor wafer having integrated circuits on a front side thereof, the method comprising:
    forming an un-patterned bi-layer wafer-level underfill material stack on the integrated circuits of the semiconductor wafer;
    patterning the un-patterned bi-layer wafer-level underfill material stack to form a patterned bi-layer wafer-level underfill material stack having regions corresponding to the integrated circuits and gaps corresponding to dicing streets between the integrated circuits;
    plasma etching to form trenches in the semiconductor wafer in alignment with the dicing streets to singulate the integrated circuits, wherein an upper layer of the patterned bi-layer wafer-level underfill material stack protects the integrated circuits during the plasma etching; and
    subsequent to the plasma etching, removing all remaining portions of the upper layer of the patterned bi-layer wafer-level underfill material stack, wherein removing all remaining portions of the upper layer of the patterned bi-layer wafer-level underfill material stack comprises performing a plasma ashing process.

23. The method of claim 22, wherein the plasma etching removes a portion of the upper layer of the patterned bi-layer wafer-level underfill material stack.

24. The method of claim 22, further comprising:
    subsequent to plasma etching, coupling one of the singulated integrated circuits to bond pads of a package substrate or die, wherein at least a portion of the patterned bi-layer wafer-level underfill material stack is retained for the coupling.

25. A method of dicing a semiconductor wafer having integrated circuits on a front side thereof, the method comprising:
    laminating a pre-patterned bi-layer wafer-level underfill material stack on the integrated circuits of the semiconductor wafer, the pre-patterned bi-layer wafer-level underfill material stack having regions corresponding to the integrated circuits and gaps corresponding to dicing streets between the integrated circuits, wherein laminating the pre-patterned bi-layer wafer-level underfill material stack on the integrated circuits of the semiconductor wafer comprises providing a lower layer of the of the pre-patterned bi-layer wafer-level underfill material stack approximately co-planar with copper pillars of the integrated circuits, and providing the upper layer covering solder bumps formed on the copper pillars; and
    plasma etching to form trenches in the semiconductor wafer in alignment with the dicing streets to singulate the integrated circuits, wherein an upper layer of the pre-patterned bi-layer wafer-level underfill material stack protects the integrated circuits during the plasma etching.

26. The method of claim 25, wherein laminating the pre-patterned bi-layer wafer-level underfill material stack on the integrated circuits of the semiconductor wafer comprises performing the lamination under vacuum.

27. The method of claim 25, wherein the plasma etching removes a portion of the upper layer of the pre-patterned bi-layer wafer-level underfill material stack.

28. The method of claim 27, wherein the plasma etching comprises using an etch gas based on a combination of $O_2$ and $SF_6$.

29. The method of claim 25, further comprising:
subsequent to plasma etching, coupling one of the singulated integrated circuits to bond pads of a package substrate or die, wherein at least a portion of the pre-patterned bi-layer wafer-level underfill material stack is retained for the coupling.

30. The method of claim 25, further comprising:
subsequent to laminating the pre-patterned bi-layer wafer-level underfill material stack on the integrated circuits of the semiconductor wafer and prior to plasma etching to form trenches in the semiconductor wafer, laser scribing the dicing streets to remove device layers from the dicing streets.

\* \* \* \* \*